United States Patent
Lee et al.

(10) Patent No.: US 10,033,012 B2
(45) Date of Patent: Jul. 24, 2018

(54) METHOD FOR MANUFACTURING LIGHT EXTRACTION SUBSTRATE

(71) Applicant: Corning Precision Materials Co., Ltd., Chungcheongnam-do (KR)

(72) Inventors: Joo Young Lee, Chungcheongnam-do (KR); Dong Hyun Kim, Chungcheongnam-do (KR); Seo Hyun Kim, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/539,864

(22) PCT Filed: Dec. 18, 2015

(86) PCT No.: PCT/KR2015/013902
§ 371 (c)(1),
(2) Date: Jun. 26, 2017

(87) PCT Pub. No.: WO2016/105027
PCT Pub. Date: Jun. 30, 2016

(65) Prior Publication Data
US 2017/0346042 A1   Nov. 30, 2017

(30) Foreign Application Priority Data
Dec. 24, 2014 (KR) .......... 10-2014-0188383

(51) Int. Cl.
*H01L 51/52* (2006.01)
*H01L 51/56* (2006.01)
(Continued)

(52) U.S. Cl.
CPC ...... *H01L 51/5268* (2013.01); *H01L 51/0097* (2013.01); *H01L 51/5012* (2013.01);
(Continued)

(58) Field of Classification Search
CPC . H01L 51/52; H01L 51/5268; H01L 51/5012; H01L 51/5206; H01L 51/5221
See application file for complete search history.

(56) References Cited

U.S. PATENT DOCUMENTS

2005/0191515 A1* 9/2005 Brese ............... B82Y 30/00
428/633
2010/0012969 A1 1/2010 Yoon et al.
(Continued)

FOREIGN PATENT DOCUMENTS

JP   2010040761 A   2/2010
JP   2014022674 A   2/2014
(Continued)

OTHER PUBLICATIONS

International Search Report for Application No. PCT/KR2015/013902 dated Apr. 19, 2016.

*Primary Examiner* — Phuc Dang
(74) *Attorney, Agent, or Firm* — Lerner, David, Littenberg, Krumholz & Mentlik, LLP (57) ABSTRACT

The present invention relates to a method for manufacturing a light extraction substrate for an organic light emitting diode, a light extraction substrate for an organic light emitting diode, and an organic light emitting diode comprising same, and more specifically, to a method for manufacturing a light extraction substrate for an organic light emitting diode, a light extraction substrate for an organic light emitting diode, and an organic light emitting diode comprising same, the method capable of complicating or diversifying the path of a light that is emitted by forming cracks on a matrix layer that can induce scattering of the light emitted from the organic light emitting diode, thereby further improving light extraction efficiency of the organic light emitting diode. To this end, provided in the present invention is the method for manufacturing the light extrac-
(Continued)

tion substrate for the organic light emitting diode, comprising: a mixture-preparing step of preparing a mixture by mixing a sol-gel solution containing a first metal oxide, and a plurality of scattering particles composed of a second metal oxide having a refractive index different from that of the first metal oxide; a mixture coating step of coating the mixture on a base substrate; and a mixture firing step of firing the mixture which has been coated to form, on the base substrate, the matrix layer comprising the first metal oxide and inside of which the scattering particles are dispersed, wherein in the mixture firing step, cracks that can induce scattering of the light emitted from the light emitting diode are formed on the matrix layer due to the difference in the coefficient of thermal expression (CTE) of the base substrate and the first metal oxide.

10 Claims, 9 Drawing Sheets

(51) Int. Cl.
  *H01L 51/00* (2006.01)
  *H01L 51/50* (2006.01)
(52) U.S. Cl.
  CPC ...... *H01L 51/5206* (2013.01); *H01L 51/5221* (2013.01); *H01L 51/56* (2013.01); *H01L 2251/303* (2013.01); *H01L 2251/5338* (2013.01)

(56) References Cited

U.S. PATENT DOCUMENTS

| | | | |
|---|---|---|---|
| 2010/0028633 A1* | 2/2010 | O'Rourke | B82Y 10/00 428/210 |
| 2010/0032701 A1 | 2/2010 | Fudeta | |
| 2011/0298370 A1* | 12/2011 | Iwabayashi | H01J 61/35 313/639 |
| 2012/0058307 A1* | 3/2012 | Yun | B05D 5/02 428/143 |
| 2013/0287936 A1* | 10/2013 | Jang | H01L 51/5212 427/98.4 |
| 2013/0341605 A1 | 12/2013 | Yoo et al. | |
| 2014/0048788 A1 | 2/2014 | Lee et al. | |
| 2014/0179510 A1* | 6/2014 | Allan | C03C 3/093 501/67 |
| 2015/0101849 A1* | 4/2015 | Bockmeyer | C03C 17/007 174/257 |
| 2017/0023452 A1* | 1/2017 | Kabir | G01N 1/405 |

FOREIGN PATENT DOCUMENTS

| | | |
|---|---|---|
| KR | 20080061695 A | 7/2008 |
| KR | 20100009527 A | 1/2010 |
| KR | 101093259 B1 | 12/2011 |
| KR | 101114917 B1 | 2/2012 |
| KR | 20120053318 A | 5/2012 |
| KR | 20140000426 A | 1/2014 |

* cited by examiner

HEATING

METHOD FOR MANUFACTURING LIGHT EXTRACTION SUBSTRATE

CROSS-REFERENCE TO RELATED APPLICATION

This application is a national phase entry under 35 U.S.C. § 371 of International Application No. PCT/KR2015/013902, filed on Dec. 18, 2015, published in Korean, which claims priority to Korean Patent Application No. 10-2014-0188383, filed on Dec. 24, 2014, the disclosures of which are incorporated herein by reference.

TECHNICAL FIELD

The present disclosure relates to a method of manufacturing a light extraction substrate for an organic light-emitting diode (OLED), a light extraction substrate for an OLED, and an OLED device including the same. More particularly, the present disclosure relates to a method of manufacturing a light extraction substrate for an OLED, wherein cracks allowing light emitted by an OLED to be scattered are formed in a matrix layer to further complexify or diversify paths of the emitted light, thereby further improving light extraction efficiency of the OLED, a light extraction substrate for an OLED, and an OLED device including the same.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission of light, wide viewing angles, high resolution, natural color reproducibility, and rapid response times.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in more detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers through which 80% of light that would otherwise be lost in the internal waveguide mode can be extracted have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from among a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

However, the effect of improving light extraction efficiency using the internal light extraction layer is still insignificant with respect to the amount of outwardly emitted light. Therefore, active research into a method or technology for further improving light extraction efficiency is in demand.

RELATED ART DOCUMENT

Korean Patent No. 1093259 (Dec. 6, 2011)

DISCLOSURE

Technical Problem

Accordingly, the present disclosure has been made in consideration of the above-described problems occurring in the related art, and the present disclosure proposes a method of manufacturing a light extraction substrate for an organic light-emitting diode (OLED), wherein cracks for causing light emitted by an OLED to be scattered are formed in a matrix layer to further complexify or diversify paths of the emitted light, thereby further improving light extraction efficiency of the OLED, a light extraction substrate for an OLED, and an OLED device including the same.

Technical Solution

According to an aspect of the present disclosure, a method of manufacturing a light extraction substrate for an OLED may include: preparing a mixture by mixing a sol-gel solution containing a first metal oxide and a number of scattering particles formed from a second metal oxide having a refractive index different from the refractive index of the first metal oxide; coating a base substrate with the mixture; and firing the mixture coating the base substrate to form a matrix layer on the base substrate, the matrix layer being formed from the first metal oxide and having the number of scattering particles dispersed therein. Cracks able to scatter light emitted by an OLED are formed in the matrix layer, due to a difference in coefficients of thermal expansion between the base substrate and the first metal oxide.

In the preparation of the mixture, a concentration of the sol-gel solution may be controlled to 1.0M or higher.

In the preparation of the mixture, the first metal oxide may be one metal oxide or a combination of two or more metal oxides selected from a candidate group consisting of $SiO_2$, $TiO_2$, $ZrO_2$, ZnO, and $SnO_2$.

In the preparation of the mixture, the first metal oxide may be rutile $TiO_2$.

After the mixture is fired, a number of irregularly shaped voids may be formed within the matrix layer.

Sizes of the number of voids may range from 50 nm to 900 nm.

In the preparation of the mixture, the second metal oxide may be one metal oxide or a combination of two or more metal oxides selected from a candidate group consisting of $SiO_2$, $TiO_2$, ZnO, and $SnO_2$.

In the preparation of the mixture, the number of scattering particles may be single-refractive-index scattering particles or multi-refractive-index scattering particles.

In the preparation of the mixture, the number of scattering particles may be a mixture of single-refractive-index scattering particles and multi-refractive-index scattering particles.

The multi-refractive-index scattering particles may respectively be comprised of a core and a shell surrounding the core, the shell having a refractive index difference from the refractive index of the core.

In the multi-refractive-index scattering particles, the core may be a hollow portion, and the shell may surround the core.

In coating the base substrate with the mixture, the mixture may be applied to the base substrate at a thickness equal to or higher than a thickness of the number of scattering particles or a total thickness of clustered scattering particles among the number of scattering particles.

The mixture may be fired at a temperature of 400° C. to 800° C.

The base substrate may be a flexible substrate.

The base substrate may be a thin glass sheet having a thickness of 1.5 mm or less.

According to another aspect of the present disclosure, a light extraction substrate for an OLED may include: a base substrate; a matrix layer disposed on the base substrate and formed from a first metal oxide; and a number of scattering particles dispersed in the matrix layer and formed from a second metal oxide having a refractive index different from the refractive index of the first metal oxide. The matrix layer has cracks dispersed therein, the cracks scattering light emitted by an OLED.

The matrix layer may be one metal oxide or a combination of two or more metal oxides selected from a candidate group consisting of $SiO_2$, $TiO_2$, $ZrO_2$, ZnO, and $SnO_2$.

The number of scattering particles may be one metal oxide or a combination of two or more metal oxides selected from a candidate group consisting of $SiO_2$, $TiO_2$, $ZrO_2$, ZnO, and $SnO_2$.

At least portions of the number of scattering particles may respectively include: a core; and a shell surrounding the core, the shell having a refractive index different from the refractive index of the core.

The core may be a hollow portion.

The cracks may be formed between scattering particles among the number of scattering particles or between clusters of scattering particles among the number of scattering particles.

At least portions of the cracks may expose the base substrate to a surface of the matrix layer.

According to another aspect of the present disclosure, an OLED device may include: a cathode; an organic light-emitting layer; and an anode disposed on the organic light-emitting layer. The above-described light extraction substrate may be disposed on the anode. The matrix layer and the number of scattering particles of the light extraction substrate may form an internal light extraction layer.

The OLED device may further include a planarization layer disposed between the anode and the light extraction substrate.

Advantageous Effects

According to the present disclosure, both the concentration of a sol-gel solution for formation of a matrix layer and the thickness of the matrix layer are controlled, such that cracks for scattering light emitted by an OLED are formed in the matrix layer, due to the difference in the coefficients of thermal expansion (CTE) between a base substrate and a metal oxide of the matrix layer during firing for forming the matrix layer. The cracks can further complexify or diversify paths of light emitted by the OLED, thereby further improving the light extraction efficiency of the OLED compared to a conventional case in which a light extraction substrate has no cracks.

MODE FOR INVENTION

Hereinafter, to a method of manufacturing a light extraction substrate for an organic light-emitting diode (OLED), a light extraction substrate for an OLED, and an OLED device including the same will be described in detail with reference to the accompanying drawings.

In the following disclosure, detailed descriptions of known functions and components incorporated in the present disclosure will be omitted in the case that the subject matter of the present disclosure may be rendered unclear by the inclusion thereof.

A method of manufacturing a light extraction substrate for an OLED according to an exemplary embodiment is a method of manufacturing a light extraction substrate (100 in FIG. 1) disposed on a path, along which light emitted by an OLED (11 in FIG. 5) exits, to function as a route on which light emitted by the OLED (11 in FIG. 5) can pass, improve the light extraction efficiency of the OLED (11 in FIG. 5), and protect the OLED (11 in FIG. 5) from the external environment.

Figure 1:
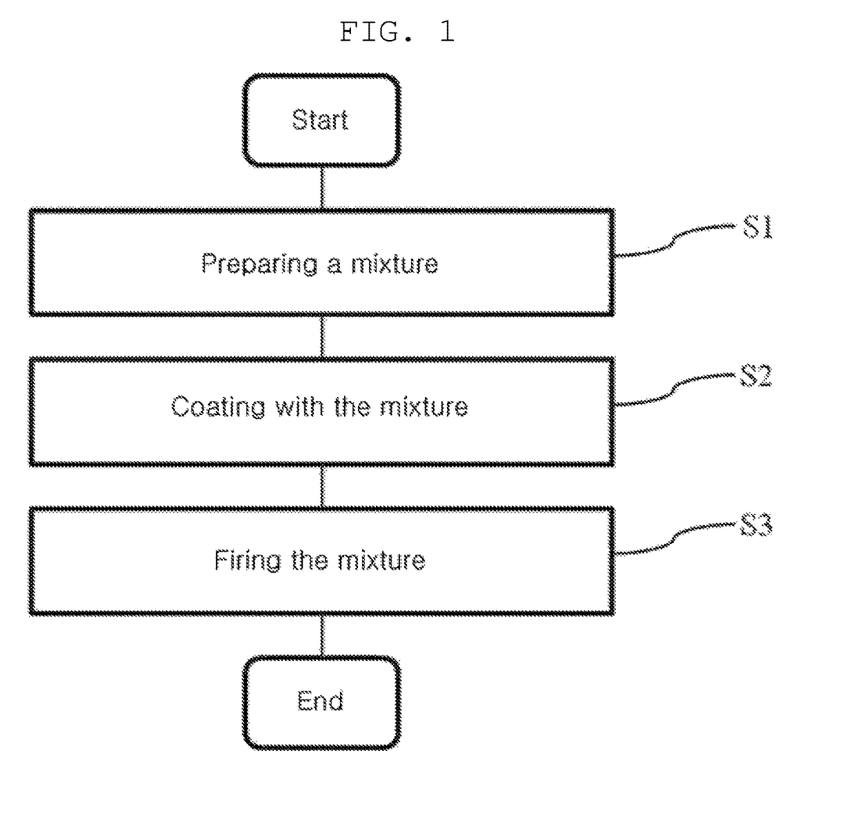
FIG. 1 is a process flowchart illustrating a method of manufacturing a light extraction substrate for an OLED according to an exemplary embodiment.

As illustrated in FIG. 1, the method of manufacturing a light extraction substrate for an OLED according to the exemplary embodiment includes a mixture preparation step S1, a mixture coating step S2, and a mixture firing step S3.

Figure 5:
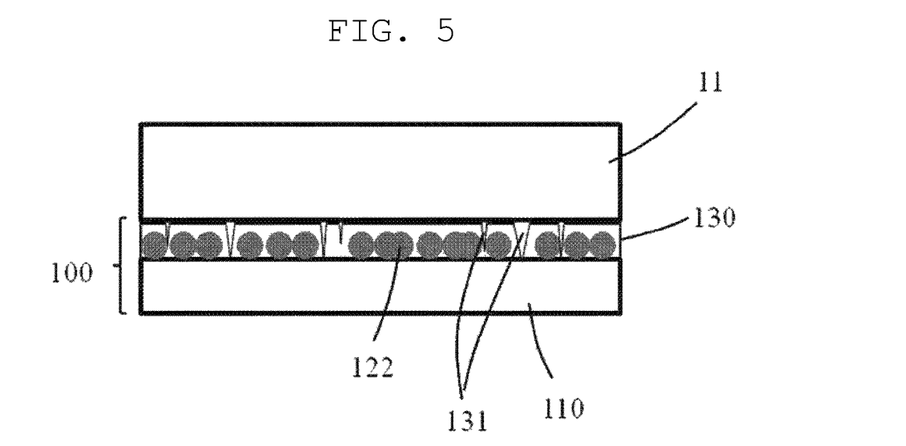
FIG. 5 is a cross-sectional view illustrating a light extraction substrate manufactured according to the exemplary embodiment.
Figure 6:
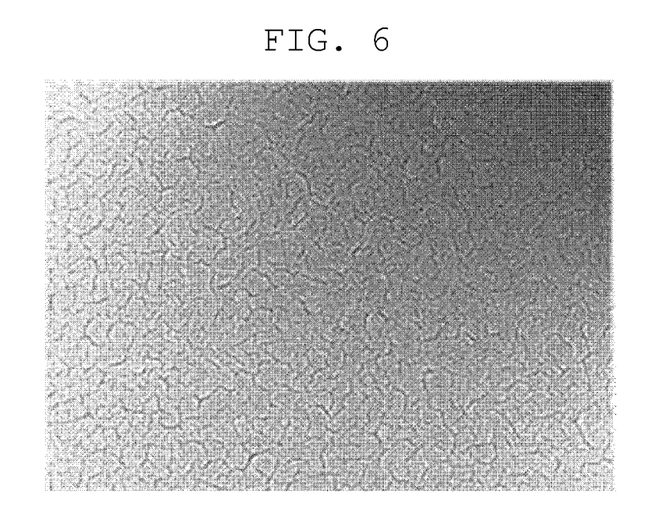
FIGS. 6 to 10 are SEM images illustrating surfaces and edges of a light extraction substrate manufactured according to Example 1 of the present disclosure.
Figure 7:
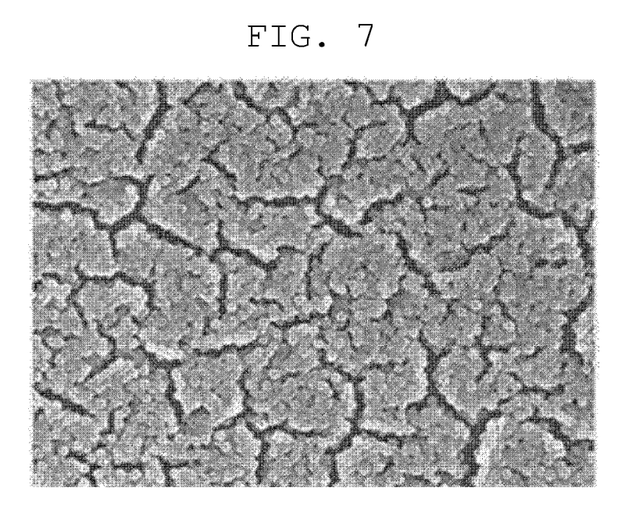
Figure 8:
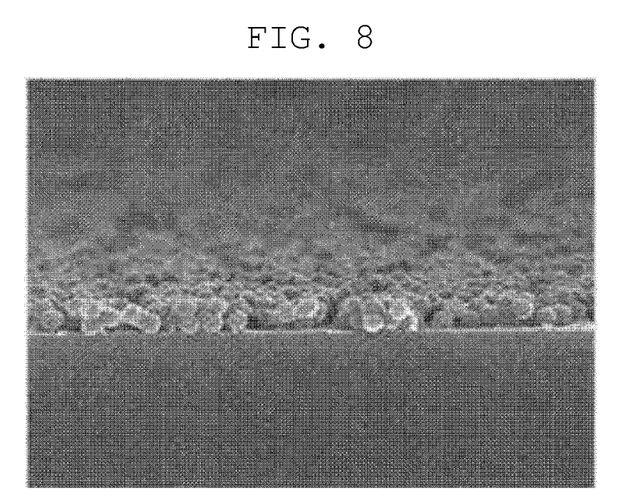
Figure 9:
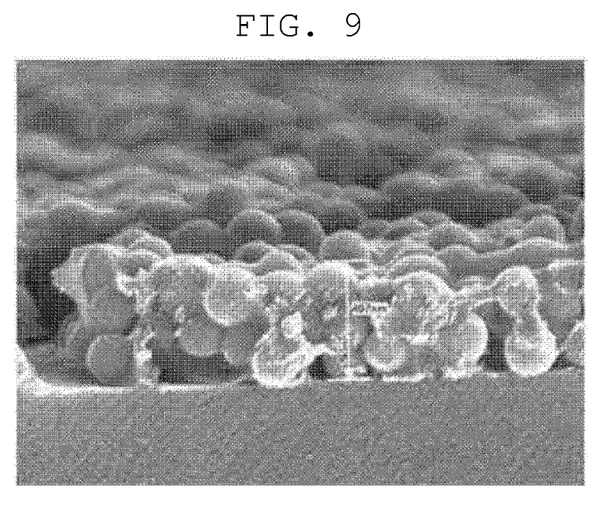
Figure 10:
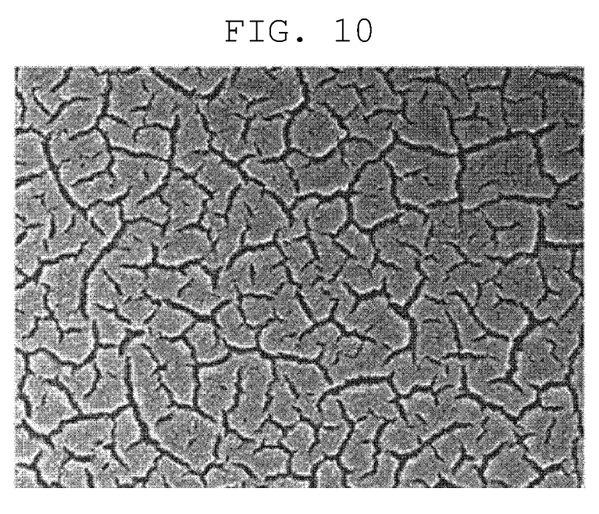

First, the mixture preparation step S1 is a step of preparing a mixture (120 in FIG. 2) for formation of an internal light extraction layer (ILEL) of the OLED device (11 in FIG. 5). In the mixture preparation step S1, the mixture (120 in FIG. 2) is prepared by mixing a sol-gel solution (121 in FIG. 2) with a number of scattering particles (122 in FIG. 2). In the mixture preparation step S1, the sol-gel solution (121 in FIG. 2) containing a first metal oxide may be used. The first metal oxide may be one metal oxide or a combination of two or more metal oxides selected from a candidate group consisting of $SiO_2$, $TiO_2$, $ZrO_2$, $ZnO$, and $SnO_2$. In particular, in the mixture preparation step S1, the first metal oxide may be rutile $TiO_2$. When the first metal oxide is rutile $TiO_2$, a number of irregularly shaped voids are formed within $TiO_2$ during the subsequent firing step. This will be described in more detail later.

In addition, in the mixture preparation step S1, the number of scattering particles (122 in FIG. 2) formed from a second metal oxide having a refractive index different from that of the first metal oxide may be used. The second metal oxide may be one metal oxide or a combination of two or more metal oxides selected from a candidate group consisting of $SiO_2$, $TiO_2$, $ZnO$, and $SnO_2$. Here, the number of scattering particles (122 in FIG. 2) used in the mixture preparation step S1 may be multi-refractive-index scattering particles. For example, in the mixture preparation step S1, the number of scattering particles (122 in FIG. 2) to be mixed with the sol-gel solution (121 in FIG. 2) may respectively be comprised of a core (123 in FIG. 2) and a shell (124 in FIG. 2) surrounding the core, the shell having a refractive index different from that of the core. In the scattering particles (122 in FIG. 2) used in the mixture preparation step S1, the cores 123 may be hollow portions. As described above, the use of the scattering particles (122 in FIG. 2) having the core-shell structure can further improve extraction efficiency for light emitted by the OLED (11 in FIG. 5) using the difference in refractive indices between the cores 123 and the shells 124.

Figure 2:
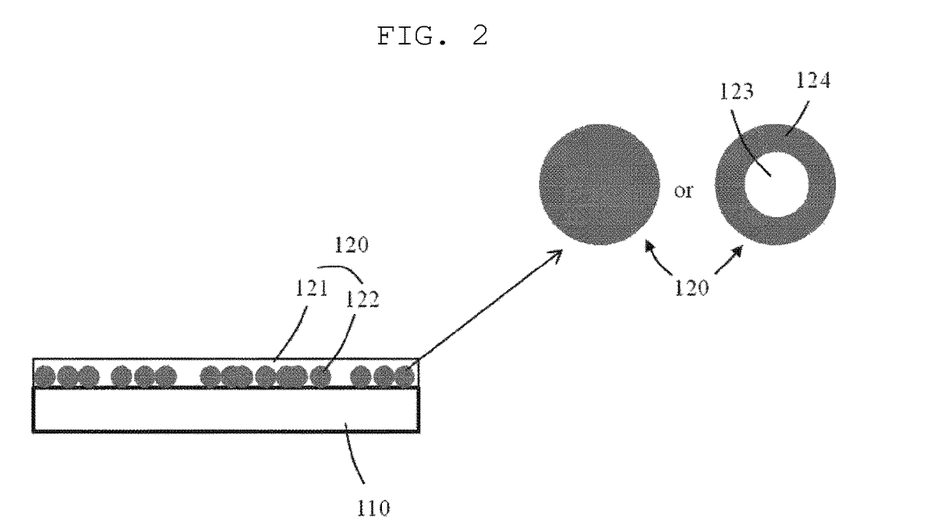
FIGS. 2 to 4 sequentially illustrate process steps of the method of manufacturing a light extraction substrate for an OLED according to the exemplary embodiment.

As described above, in the mixture preparation step S1 according to the exemplary embodiment, the scattering particles having the core-shell structure can be used to form at least portions of the number of scattering particles (122 in FIG. 2) to be mixed with the sol-gel solution (121 in FIG. 2). That is, in the mixture preparation step S1, the number of scattering particles (122 in FIG. 2) to be mixed with the sol-gel solution (121 in FIG. 2) may be prepared by mixing single-refractive-index scattering particles and multi-refractive-index scattering particles respectively having the core-shell structure at a predetermined ratio. Alternatively, in the mixture preparation step S1, the number of scattering particles (122 in FIG. 2) may be only comprised of single-refractive-index scattering particles or multi-refractive-index scattering particles.

In addition, in the mixture preparation step S1, it is necessary to control the concentration of the sol-gel solution (121 in FIG. 2) to be 1.0M or higher, so that cracks (131 in FIG. 4) are created in the matrix layer (130 in FIG. 4) formed by the firing of the sol-gel solution (121 in FIG. 2) in the subsequent mixture firing step S3, due to the difference in coefficients of thermal expansion (CTE) between the base substrate (110 in FIG. 2) and the first metal oxide contained in the sol-gel solution (121 in FIG. 2).

Subsequently, as illustrated in FIG. 2, the mixture coating step S2 is a step of coating the top surface of the base substrate 110 with the mixture 120 prepared in the mixture preparation step S1. In the mixture coating step S2, the mixture 120 may be applied to the base substrate 110 at a thickness equal to or higher than the thickness of the scattering particles 122, so that the cracks (131 in FIG. 4) are created in the matrix layer (130 in FIG. 4) formed by the firing of the sol-gel solution 121 in the subsequent mixture firing step S3, due to the difference in CTE between the base substrate 110 and the first metal oxide contained in the sol-gel solution 121. When several scattering particles 122 of the number of scattering particles are clustered into two layers, the thickness of the scattering particles 122 includes the total thickness of the scattering particles clustered in two layers.

In other words, to form the cracks (131 in FIG. 4) in the matrix layer (130 in FIG. 4), it is necessary to control the concentration of the sol-gel solution 121 in the mixture preparation step S1 and to control the thickness of the mixture 120 in the mixture coating step S2.

When the light extraction substrate (100 in FIG. 5) manufactured according to the exemplary embodiment is used in an OLED device including the OLED (11 in FIG. 5), the base substrate 110 coated with the mixture 120 is disposed in a front portion of the OLED device, i.e. a portion through which light generated by the OLED (11 in FIG. 5) exits, to allow the light to exit while functioning as an encapsulation substrate to protect the OLED (11 in FIG. 5) from the external environment. The base substrate 110 may be a transparent substrate formed from any transparent material having superior light transmittance and excellent mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass ($SiO_2$-CaO—$Na_2O$) or aluminosilicate glass ($SiO_2$-$Al_2O_3$-$Na_2O$). When the OLED device including the light extraction substrate (100 in FIG. 5) manufactured according to the exemplary embodiment is used for lighting, the base substrate 110 may be formed from soda-lime glass. In addition, the base substrate 110 may also be a substrate formed from a metal oxide or a metal nitride. According to the exemplary embodiment, the base substrate 110 may be a flexible substrate, more particularly, a thin glass sheet having a thickness of 1.5 mm or less. The thin glass sheet may be manufactured using a fusion process or a floating process.

Figure 3:
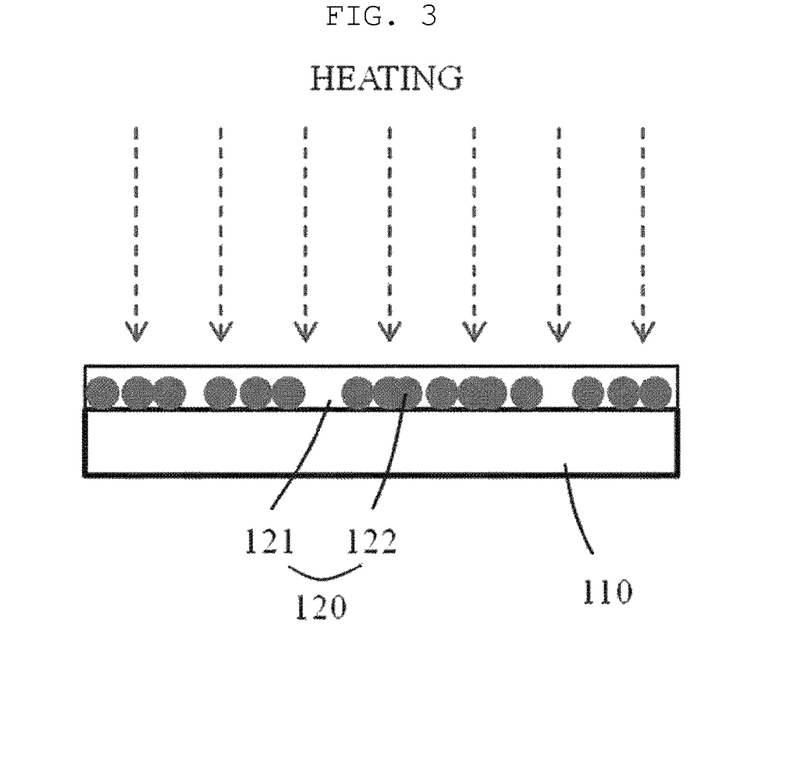

Subsequently, as illustrated in FIG. 3, the mixture firing step S3 is a step of firing the mixture 120 applied on top of the base substrate 110 in the mixture coating step S2. In addition, the mixture firing step S3 is the step of forming the matrix layer (130 in FIG. 4) on the base substrate 110 by firing the mixture 120, the matrix layer being formed from the first metal oxide and having the number of scattering particles 122 dispersed therein.

Figure 4:
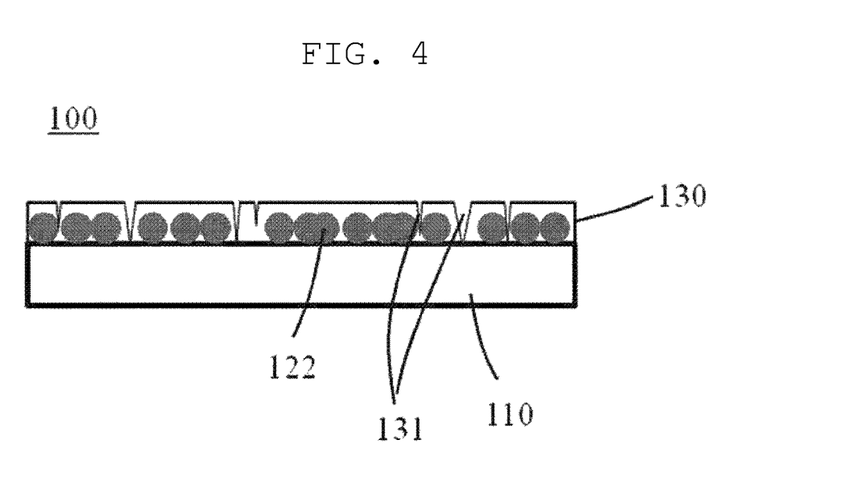

In the mixture firing step S3 according to the exemplary embodiment, the mixture 120 is fired at a temperature of 400° C. to 800° C. When the mixture 120 is fired within this temperature range, as illustrated in FIG. 4, the cracks 131 able to scatter light emitted by the OLED (11 in FIG. 5) are formed in the matrix layer 130. That is, the cracks 131 can further complexify or diversify paths of light emitted by the OLED (11 in FIG. 5). The cracks 131 formed in the matrix layer 130 extend in the direction from the surface of the matrix layer 130 toward the base substrate 110. Here, portions or all of the cracks 131 may be formed to expose the base substrate 110 to the surface of the matrix layer 130. In addition, the cracks 131 may be formed between scattering particles among the number of scattering particles 122 or between the clusters of several scattering particles among the number of scattering particles 122.

The cracks 131 are induced during the firing of the mixture 120 in the mixture firing step S3, due to the difference in CTE between the base substrate 110 and the first metal oxide of the sol-gel solution 121. The control over the concentration of the sol-gel solution 121 in the mixture preparation step S1 and the control over the thickness of the mixture 120 in the mixture coating step S2 act as factors in substantially creating or promoting the cracks 131 induced due to the CTE difference. Specifically, when the concentration of the sol-gel solution 121 is controlled in the mixture preparation step S1 and the coating thickness of the mixture 120 is controlled in the mixture coating step S2, the degree of the cracks 131 created in the matrix layer 130 due to the difference in CTE between the base substrate 110 and the first metal oxide of the sol-gel solution 121 can be controlled. This also indicates that the degree of hazing of the matrix layer 130 can be adjusted. For example, it is possible to modify the haze value of the matrix layer 130 to be within a range of about 5% to about 85%, as required, by controlling the concentration of the sol-gel solution 121 and the thickness of the mixture 120.

Figure 16:
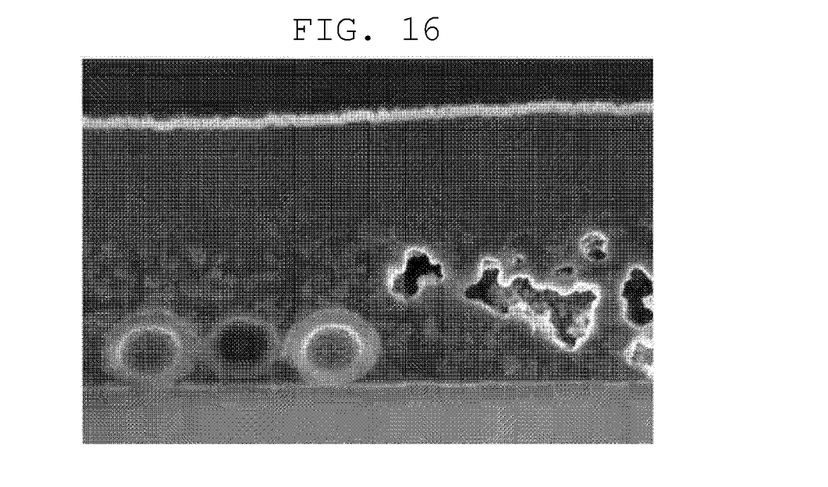
FIG. 16 is an SEM image of a matrix layer composed of rutile 1102.

In addition, when rutile TiO2 is used in the mixture preparation step S1 as the first metal oxide of the sol-gel solution 121 for formation of the matrix layer 130 after being fired, as illustrated in a scanning electron microscope (SEM) image in FIG. 16, a number of irregularly shaped voids are formed within TiO2. The sizes of the number of voids may range from 50 nm to 900 nm. The number of voids form a complexified scattering structure together with the number of scattering particles 122 to improve the light extraction efficiency of the OLED (11 in FIG. 5). The number of voids can realize a light scattering effect equal to or higher than the light scattering effect of the number of scattering particles 122. That is, the more the irregularly shaped voids are formed within the matrix layer 130, i.e. the greater the area of the number of voids within the matrix layer 130 is, the higher light extraction efficiency can be realized. As described above, when more voids are formed within the matrix layer 130, the use of expensive scattering particles 122 can be reduced, thereby reducing manufacturing costs.

When the mixture firing step S3 is finished, the light extraction substrate 100 for an OLED is manufactured according to the exemplary embodiment.

As illustrated in FIG. 5, the light extraction substrate 100 manufactured as described above is disposed on one surface of the OLED 11, through which light generated by the OLED 11 exits, to serve as a function substrate to improve the light extraction efficiency of the OLED 11. Here, the matrix layer 130 having the cracks 131 and the number of scattering particles 122 dispersed within the matrix layer 130 form an internal light extraction layer (ILEL) of the OLED 11. The internal light extraction layer can significantly improve extraction efficiency for light emitted by the OLED 11, based on the complexified light scattering structure obtained by the cracks 131, the matrix layer 130, and the scattering particles 122 including core-shell structure particles respectively comprised of the core 123 and the shell 124, the difference in refractive indices between the cracks 131 and the matrix layer 130, the difference in refractive indices between the matrix layer 130 and the scattering particles 122, and the difference in refractive indices between the core 123 and the shell 124.

Although not specifically illustrated, the OLED 11 has a multilayer structure including an anode, an organic light-emitting layer, and a cathode, sandwiched between the light extraction substrate 100 according to the exemplary embodiment and another substrate (not shown) facing the light extraction substrate 100 to encapsulate the OLED 11. The anode abuts to the matrix layer 130 of the light extraction substrate 100 according to the exemplary embodiment. The matrix layer 130 according to the exemplary embodiment may have a low level of flatness in the surface abutting to the anode, due to the cracks 131. In this case, the surface shape of the matrix layer 130 may be transferred to the anode, thereby degrading the electrical properties of the OLED 11. To prevent this, a planarization layer may be provided between the matrix layer 130 and the anode.

The anode may be formed from a metal or metal oxide having a greater work function, such as Au, In, Sn, or indium tin oxide (ITO), to facilitate hole injection. The cathode may be a metal thin film formed from Al, Al:Li, or Mg:Ag that has a smaller work function to facilitate electron injection. The organic light-emitting layer may include a hole injection layer, a hole transport layer, an emissive layer, an electron transport layer, and an electron injection layer that are sequentially stacked on the anode.

According to this structure, when a forward voltage is induced between the anode and the cathode, electrons migrate from the cathode to the emissive layer through the electron injection layer and the electron transport layer, while holes migrate from the anode to the emissive layer through the hole injection layer and the hole transport layer. The electrons and the holes that have migrated into the emissive layer recombine with each other, thereby generating excitons. When these excitons transit from an excited state to a ground state, light is generated. The brightness of the generated light is proportional to the amount of current flowing between the anode and the cathode.

When the OLED 11 is a white OLED used for lighting, the light-emitting layer may have, for example, a multilayer structure comprised of a high-molecular light-emitting layer that emits blue light and a low-molecular light-emitting layer that emits orange-red light. In addition, a variety of other structures that emit white light may be used.

According to the exemplary embodiment, the organic light-emitting layer may also have a tandem structure. In this case, a plurality of organic light-emitting layers alternating with interconnecting layers (not shown) may be provided.

Example 1

SiO2 particles having diameters of 200 nm were mixed with a 1.5M TiO2 sol-gel solution, a substrate was coated with the resultant mixture, and then firing was performed. FIGS. 6 to 10 are SEM images illustrating the fired mixture. Cracks formed in the mixture, i.e. a TiO2 matrix layer having SiO2 particles dispersed therein, are visually recognizable. Subsequently, the matrix layer was taken as a light extraction layer of an OLED, and then the light extraction efficiency of the OLED was measured. The measured light extraction efficiency was about 1.7 times the light extraction efficiency of an OLED without a light extraction layer.

Example 2

Figure 11:
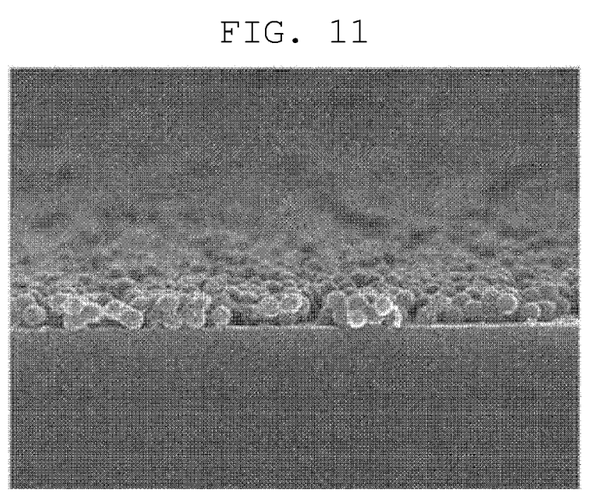
FIGS. 11 and 12 are SEM images of a light extraction substrate manufactured according to Example 2 of the present disclosure.
Figure 12:
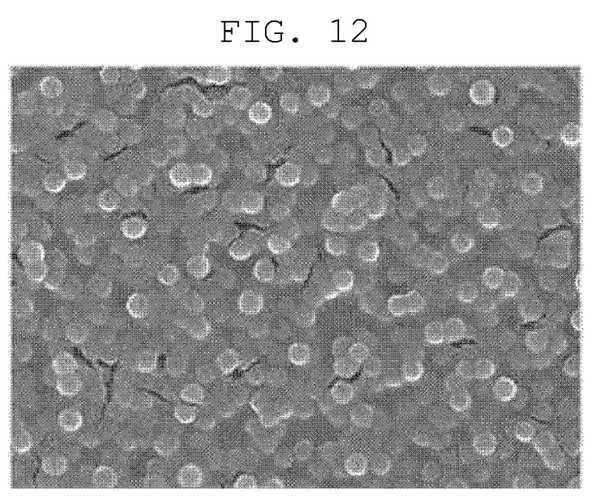

SiO2 particles having diameters of 400 nm were mixed with a 1.5M TiO2 sol-gel solution, a substrate was coated with the resultant mixture at a thickness of 800 nm, and then firing was performed. FIGS. 11 to 12 are SEM images illustrating the fired mixture. Small cracks formed in the mixture, i.e. a TiO2 matrix layer having SiO2 particles dispersed therein, are visually recognizable.

Comparative Example 1

Figure 13:
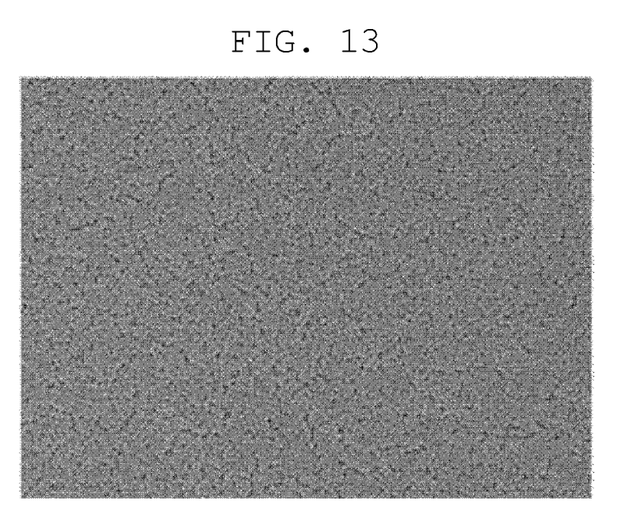
FIGS. 13 to 15 are SEM images of a light extraction substrate manufactured according to Comparative Example 1.
Figure 14:
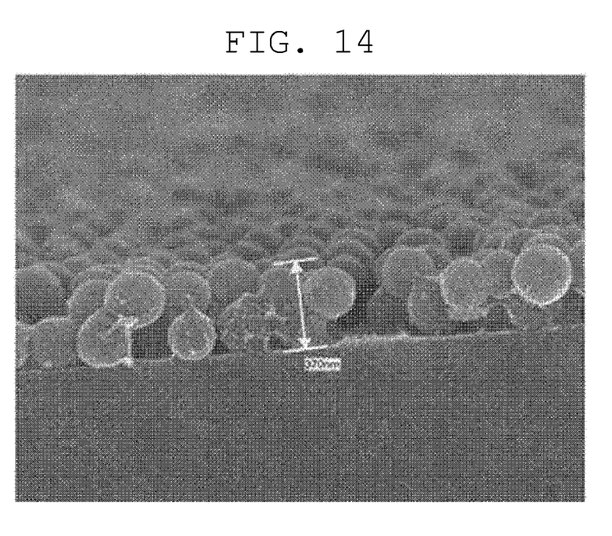
Figure 15:
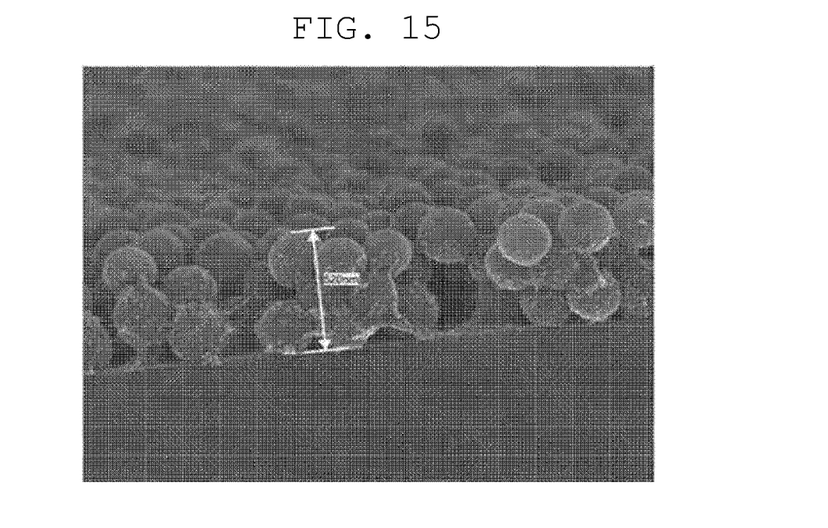

SiO2 particles having diameters of 400 nm were mixed with a 0.5M TiO2 sol-gel solution, a substrate was coated with the resultant mixture, and then firing was performed. FIGS. 13 to 15 are SEM images illustrating the fired mixture. No cracks are visually recognizable in the mixture, i.e. a TiO2 matrix layer having SiO2 particles dispersed therein. Subsequently, the matrix layer was taken as a light extraction layer of an OLED, and then the light extraction efficiency of the OLED was measured. The measured light extraction efficiency was about 1.5 times the light extraction efficiency of an OLED without a light extraction layer.

Comparing the light extraction efficiency of Example 1 with the light extraction efficiency of Comparative Example 1, the degree of improvement of Comparative Example 1 is lower than the degree of improvement of Example 1. This suggests that the cracks in Example 1 contributed to the improved light extraction efficiency in Example 1 by a degree corresponding to the difference in the light extraction efficiency between Example 1 and Comparative Example 1.

The foregoing descriptions of specific exemplary embodiments of the present disclosure have been presented with respect to the drawings. They are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A method of manufacturing a light extraction substrate for an organic light-emitting diode, the method comprising:
   preparing a mixture by mixing a sol-gel solution containing a first metal oxide comprising rutile $TiO_2$ and a number of scattering particles formed from a second metal oxide having a refractive index different from a refractive index of the first metal oxide;
   coating a base substrate with the mixture; and
   firing the mixture coating the base substrate to form a matrix layer on the base substrate, the matrix layer being formed from the first metal oxide and having the number of scattering particles dispersed therein,
   wherein cracks able to scatter light emitted by an organic light-emitting diode are formed in the matrix layer, due to a difference in coefficients of thermal expansion between the base substrate and the first metal oxide, and
   wherein, after the mixture is fired, a number of irregularly shaped voids are formed within the matrix layer.

2. The method of claim 1, wherein, in preparing the mixture, a concentration of the sol-gel solution is controlled to 1.0M or higher.

3. The method of claim 1, wherein sizes of the number of voids range from 50 nm to 900 nm.

4. The method of claim 1, wherein, in preparing the mixture, the second metal oxide comprises one metal oxide or a combination of two or more metal oxides selected from a candidate group consisting of $SiO_2$, $TiO_2$, ZnO, and $SnO_2$.

5. The method of claim 4, wherein, in preparing the mixture, the number of scattering particles comprise single-refractive-index scattering particles or multi-refractive-index scattering particles.

6. The method of claim 5, wherein, in preparing the mixture, the number of scattering particles comprise a mixture of single-refractive-index scattering particles and multi-refractive-index scattering particles.

7. The method of claim 1, wherein, in coating the base substrate with the mixture, the mixture is applied to the base substrate at a thickness equal to or higher than a thickness of the number of scattering particles or a total thickness of clustered scattering particles among the number of scattering particles.

8. The method of claim 1, wherein the mixture is fired at a temperature of 400° C. to 800° C.

9. The method of claim 1, wherein the base substrate comprises a flexible substrate.

10. The method of claim 9, wherein the base substrate comprises a thin glass sheet having a thickness of 1.5 mm or less.

* * * * *